(12) United States Patent
Le et al.

(10) Patent No.: US 7,861,129 B2
(45) Date of Patent: Dec. 28, 2010

(54) INTEGRATED CIRCUIT FOR WRITING AND READING REGISTERS DISTRIBUTED ACROSS A SEMICONDUCTOR CHIP

(75) Inventors: Thuyen Le, Taufkirchen (DE); Cedric Lichtenau, Stuttgart (DE); Martin Padeffke, Hildrizhausen (DE); Thomas Pflueger, Leinfelden (DE)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 12/109,529

(22) Filed: Apr. 25, 2008

(65) Prior Publication Data

US 2008/0270860 A1 Oct. 30, 2008

(30) Foreign Application Priority Data

Apr. 25, 2007 (EP) ................................. 07106902

(51) Int. Cl.
*G01R 31/28* (2006.01)
(52) U.S. Cl. ........................ 714/726; 714/727; 714/729
(58) Field of Classification Search .................. 714/726, 714/727, 729
See application file for complete search history.

(56) References Cited

U.S. PATENT DOCUMENTS

2006/0277436 A1* 12/2006 McGowan ................... 714/30
2008/0126892 A1* 5/2008 Dubey et al. ................ 714/718

* cited by examiner

*Primary Examiner*—Jeffrey A Gaffin
*Assistant Examiner*—Guerrier Merant
(74) *Attorney, Agent, or Firm*—John A. Gibbons; Fleit Gibbons Gutman Bongini & Bianco PL

(57) ABSTRACT

An integrated circuit on a semiconductor chip with a plurality of registers distributed across the semiconductor chip. The registers are writeable and readable. The integrated circuit comprises a central control block. The integrated circuit comprises a plurality of circuit units. The circuit unit includes a functional portion with a local clock controller and one or more of the registers. The circuit unit includes a satellite portion. The central control block and the satellite portions are serially connected together and form a scan chain, wherein the scan chain is formed as a ring.

20 Claims, 4 Drawing Sheets

INTEGRATED CIRCUIT FOR WRITING AND READING REGISTERS DISTRIBUTED ACROSS A SEMICONDUCTOR CHIP

BACKGROUND OF THE INVENTION

1. Field of the Invention

The present invention relates to an integrated circuit for writing and reading registers distributed across a semiconductor chip.

2. Description of the Related Art

Conventional integrated circuits include a plurality of different components. Some components need to be configured and/or monitored during the power-on-reset (POR) cycle or even while the integrated circuit is running in the normal operation mode. A general structure of the integrated circuit includes a central control block and a plurality of circuit units. The registers are distributed over the chip. Access to the central block can be requested from one or more internal and external masters. An example of the internal master is a POR engine. Another example of the internal master is the core of a processor. The external master may access to the central control block via JTAG, I2C or any proprietary protocols. An example of the external master is a service processor.

One conventional approach includes a hardware logic based on a serial protocol. The hardware logic is running with functional clocks. However, there are may be problems. The functional clocks have to be available. A phase-locked loop (PLL) and a clock control unit have to be already available. Hence, these approaches according may not be useful for the phase-locked loop and the clock control unit during the power-on-reset cycle. Further, the use of the functional clocks requires a special handshaking and synchronization logic for the data to cross asynchronous clock domain boundaries.

FIG. 4 illustrates a conventional integrated circuit. The integrated circuit includes a central control block 10 and a plurality of conventional circuit units 60. A portion of the conventional circuit units 60 are serially connected together via an address and data line 16. Each conventional circuit unit 60 includes a satellite portion 66. This series is additionally connected to the central control block 10 and to first converters 62 via the address and data line 16. The central control block 10, the part of the conventional circuit units 60, the first converters 62 and the address and data line 16 form a ring. The address and data line 16 may be one serial line. Alternatively the address and data line 16 may have one line for addresses and another line for data.

Each of the first converters 62 is connected to a second converter 64 via a first bus 68 and second bus 70. The first bus is a unidirectional bus from the second converter 64 to the first converter 62. The second bus 70 is a unidirectional bus from the first converter 62 to the second converter 64. The first converter 62 and the corresponding second converter 64 form an asynchronous converter block.

Another part of the conventional circuit units 60 and one of the second converters 64 are serially connected via a further address and data line 72 and form another ring. The other second converter 64 is integrated in a separate conventional circuit unit 60.

The first asynchronous converter block connects the one ring formed by the address and data line 16 to the other ring formed by the address and data line 72. A second asynchronous converter block connects said one ring to a single conventional circuit unit 60 with the internal satellite portion 66.

The central control block 10 selects the address and data line 16, which form a ring. Then the central control block 10 shifts an address package into the address and data line 16. The address package comprises the address of a satellite portion 66, the address of a target register and the operation mode. The operation mode may be a write or a read operation. The addressed satellite portion will acknowledge a bit within the bit-stream. The structure of the bit-stream depends on the protocol.

In the case of the write operation the addressed satellite portion 66 waits for a data package to arrive. Then, the addressed satellite portion 66 performs a data access as specified by the operation mode. In the case of the read operation, the satellite portion 66 will fetch the data from the register and serialize it on the address and data line 16 in order to send the data back to the central control block 10. With this approach, it is possible to access one specific satellite portion 66 at a time. In a special case, all satellite portions 66 of the ring chosen are accessed, if an a priori known broadcast address is used. However, it may not be easy to select a variable set of the satellite portions 66.

If the address and data line 16 have to cross an asynchronous clock boundary, then the handshaking logic has to be used. The handshaking logic is in the asynchronous converter block comprising the converters 62 and 64. However, the use of the functional clocks requires a special handshaking and synchronization logic for the data in order to cross the asynchronous clock domain boundaries.

SUMMARY OF THE INVENTION

One embodiment of the present invention provides an improved method for configuring and monitoring of integrated circuits with scanning functionality and a corresponding integrated circuit.

In one embodiment of the invention, scan chains are used as dedicated scan clocks. The scan chain is formed as a ring. The integrated circuit is subdivided into circuit units with an own clock controller and an own satellite portion. The satellite portions of said circuit units are serially connected to the scan chain. The satellite portions connect the circuit units to the scan chain, but have no functional components.

A central control block forms a part of the scan chain. The central control block may operate as a scan engine. The satellite portion may include at least one bit-stream register. Said bit-stream registers of the control units form the scan chain. The scan chain may be a serial address and data line. The dedicated scan clocks are created by a local clock controller in each circuit unit.

One embodiment of the present invention has the advantage that during the power-on-reset cycle all registers connected to these specialized scan chains can be accessed without functional clocks running.

A further advantage of an embodiment of the present invention is that no synchronization overhead is required for the scan chains to cross asynchronous functional clock domains.

Another advantage of an embodiment of the present invention is that an arbitrary number of satellite portions can be accessed independently each time. This is regardless of the type of the access. For example, the access may be a read operation, a write operation or a mixture of read and write operations. The satellite portions can be separately selected, in particular by the central control block.

BRIEF DESCRIPTION OF THE DRAWINGS

The above as well as additional objectives, features and advantages of the present invention become apparent in the following detailed written description.

The novel and inventive features believed to the characteristics of the invention are set forth in the appended claims. The invention itself and its advantages are best understood by reference to the following detailed description of preferred embodiments in conjunction with the accompanied drawings.

DETAILED DESCRIPTION OF THE INVENTION

Figure 1:
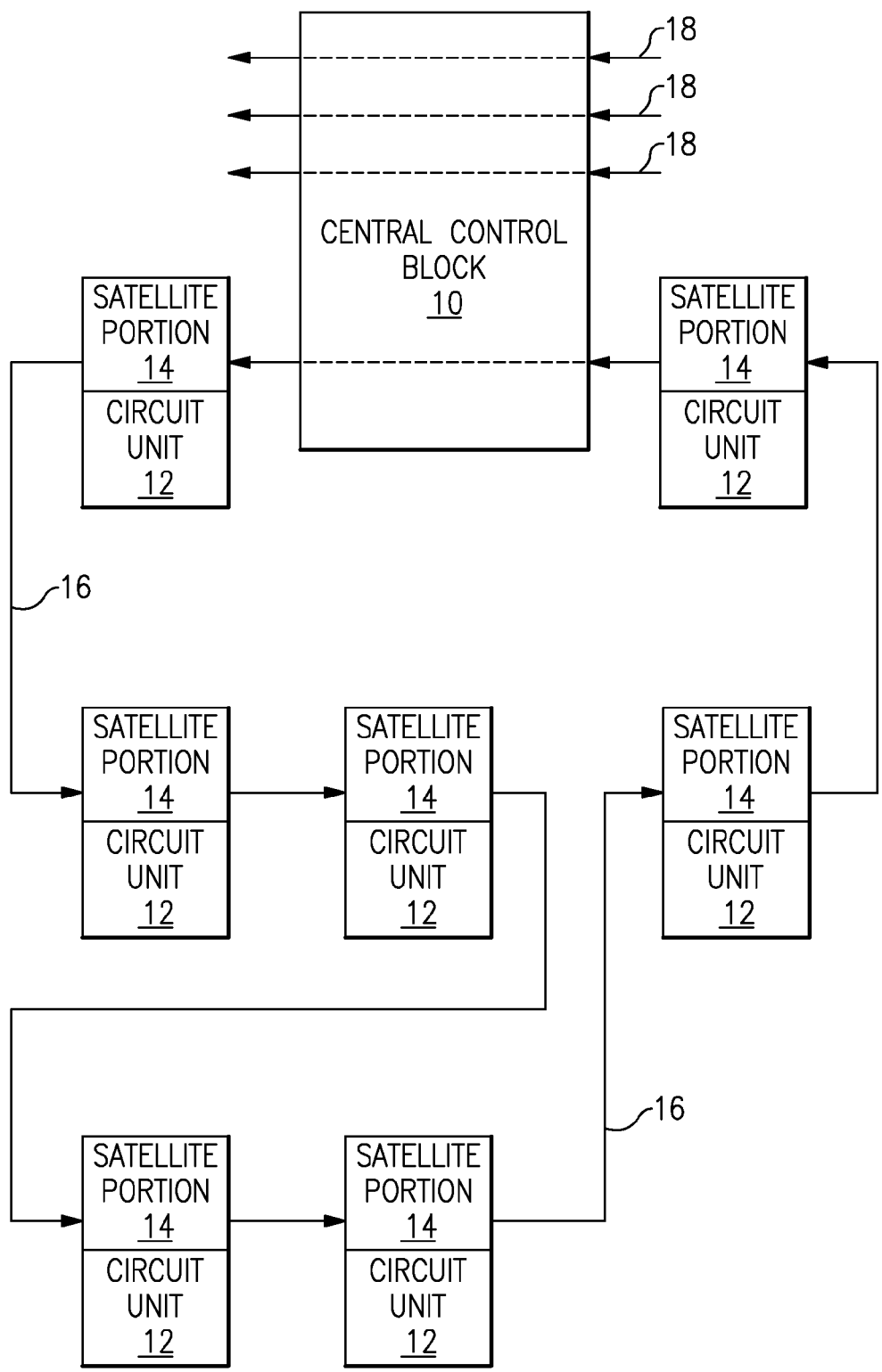
FIG. 1 illustrates a schematic block diagram of a part of an integrated circuit according to a preferred embodiment of the present invention.

FIG. 1 illustrates a schematic block diagram of a part of an integrated circuit according to a preferred embodiment of the present invention. The integrated circuit includes a central control block 10 and a plurality of circuit units 12. Each of the circuit units 12 comprises a satellite portion 14. The satellite portions 14 are serially connected together by an address and data line 16. The central control block 10 is connected to the first and last satellite portions 14 of the series. Thus, the central control block 10 and the satellite portions 14 are connected to ring via the address and data line 16. The ring forms a closed scan chain.

The satellite portion 14 is an integrated part of the circuit unit 12. The circuit unit 12 is connected to the scan chain via the satellite portion 14. However, the satellite portion 14 is not a functional part of the circuit unit 12 in the normal operation mode. This structure allows to configure and to monitor the integrated circuit by scanning functionality without using functional clocks.

Additionally, the central control block 10 is connected to a plurality of further address and data lines 18. Each of the further address and data lines 18 may form a ring with circuit units 12 and integrated satellite portions 14.

Figure 2:
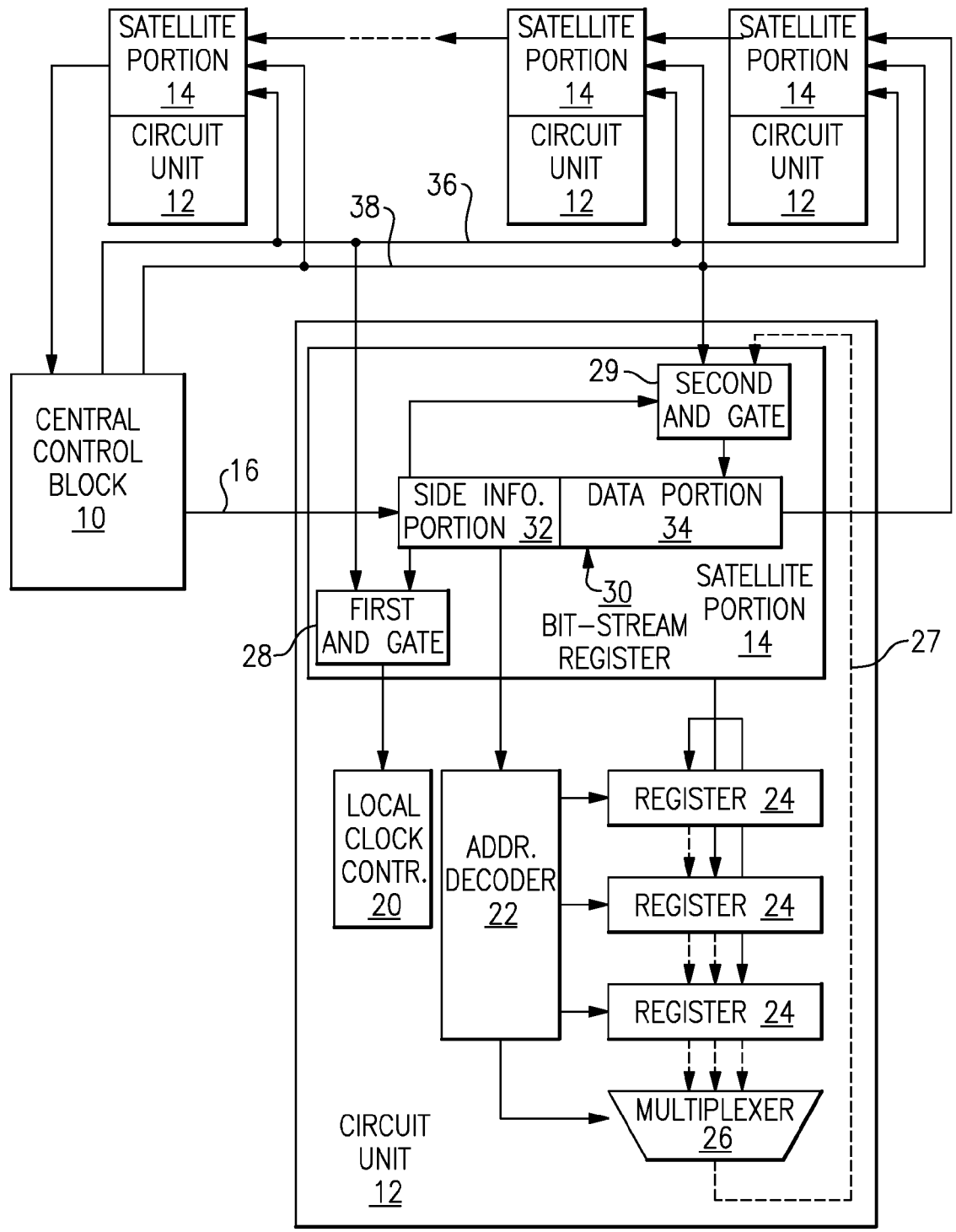
FIG. 2 illustrates a schematic detailed diagram of a circuit unit within the integrated circuit according to the preferred embodiment of the present invention.

FIG. 2 illustrates a schematic detailed diagram of the circuit unit 12 within the integrated circuit according to the preferred embodiment of the present invention. FIG. 2 shows in detail the circuit unit 12 with the satellite portion 14. The circuit unit 12 comprises a local clock controller 20, an address decoder 22, a plurality of registers 24, a multiplexer 26 and a feedback line 27.

The satellite portion 14 is an integrated part of the circuit unit 12. The satellite portion 14 comprises a first AND gate 28, a second AND gate 29 and a bit-stream register 30. The bit-stream register 30 includes a side information portion 32 and a data portion 34. The side information portion 32 contains in particular select bits and addresses. The output of the first AND gate 28 is connected to the local clock controller 20. The output of the second AND gate 29 is connected to the data portion 34.

From the side information portion 32 the select bits are sent to the address decoder 22 and to the first AND gate 28 and second AND gate 29. The addresses are sent from the side information portion 32 to the address decoder 22. The address decoder 22 controls the registers 24 and the multiplexer 26. From the data portion 34 the data are shifted to the registers 24 and to the multiplexer 26. The data portion 34, the registers 24 and the multiplexer 26 are connected via data lines. The output of the multiplexer 26 is connected to the input of the second AND gate 29 via a feedback line 27.

The detailed circuit unit 12 is connected to the other circuit units 12 and to the central control block 10 via the address and data line 16 in the way described in FIG. 1.

FIG. 2 shows additionally a write-update line 36 and a read-capture line 38. The central control block 10 and the circuit units 12 are interconnected via the write-update line 36 and the read-capture line 38. Further, the write-update line 36 is connected to the input of the first AND gate 28, and the read-capture line 38 is connected to the input of the second AND gate 28.

The central control block 10 generates the dedicated scan clocks in order to shift the serial bit-stream 30 into the address and data line 16. The corresponding registers can be set even in a power-on-reset (POR) cycle without any functional clock signal. For example, also the control bits of a phase-locked loop (PLL) within a system can be set in the POR cycle by the method according to an embodiment of the present invention.

The central control block 10 shifts the data package through the complete ring formed by the address and data line 16. An application specific protocol is defined.

In the example of FIG. 2, the side information with the select signal and the write-update signal are used to activate a local clock controller 20 in order capture the data into the selected register. Hence, after the data is shifted into the ring formed by the address and data line 16, one or more satellite portions 14 can be selected independent of each other.

Figure 3:
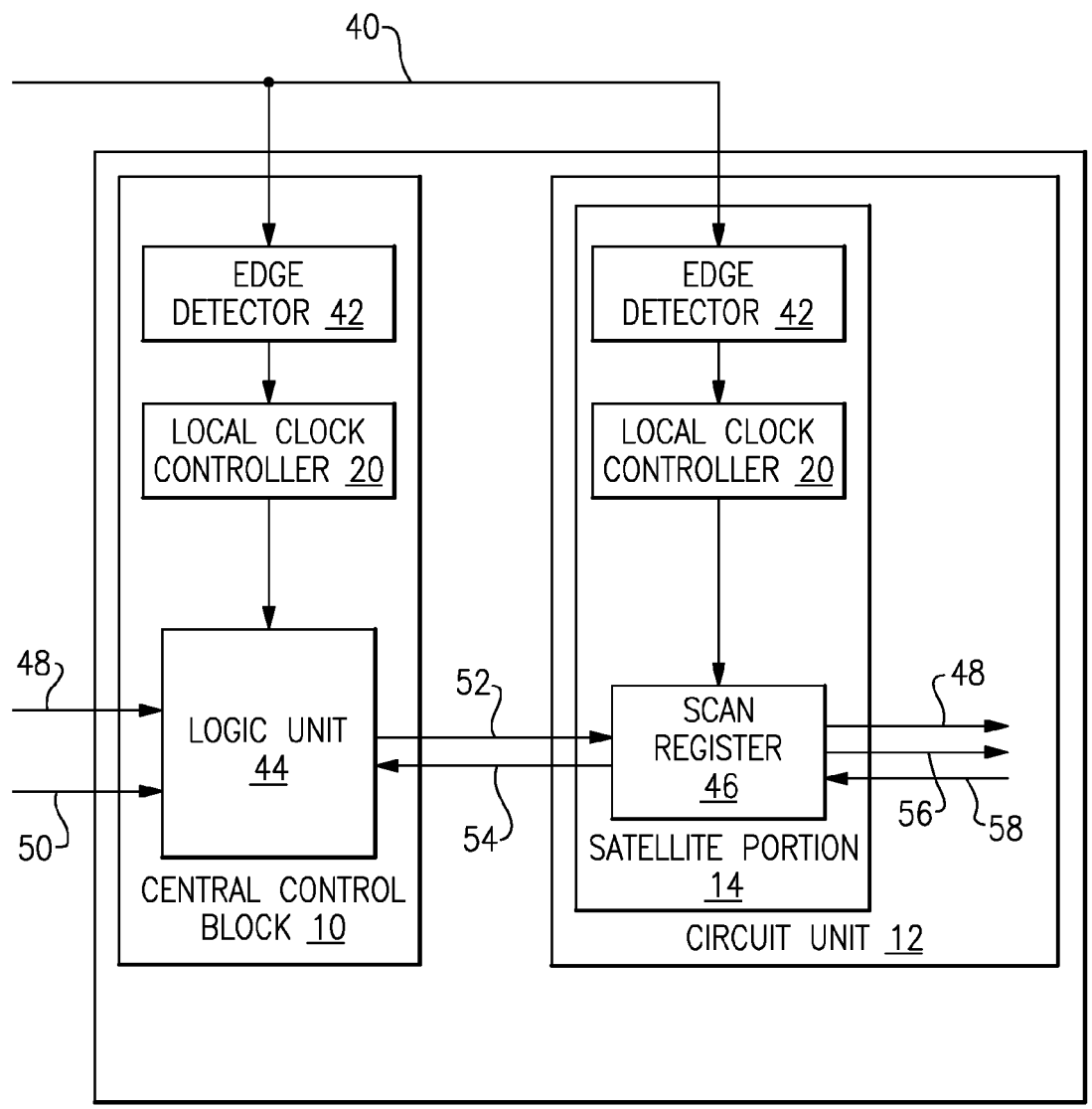
FIG. 3 illustrates a schematic detailed diagram of a central control block and a satellite portion within the integrated circuit according to a further embodiment of the present invention.

FIG. 3 illustrates a schematic detailed diagram of a central control block and a satellite portion within the integrated circuit according to a further embodiment of the present invention. Said further embodiment is an extended version provided for the general scan design (GSD) test methodology. In FIG. 3, a schematic detailed diagram of the central control block 10 and the satellite portion 14 within the integrated circuit according to the preferred embodiment of the present invention is shown. The other part of the circuit unit 12 is not shown in FIG. 3. The central control block 10 includes an edge detector 42, a local clock controller 20 and a logic unit 44. The edge detector 42 of the central control block 10 is connected to an external clock signal 40. The satellite portion 14 includes also an edge detector 42 and a local clock controller 20. Further, the satellite portion 14 comprises a scan register 46. The edge detector 42 of satellite portion 14 is also is connected to the external clock signal 40.

A control line 48 and a data line 50 are connected to the logic unit 44. The logic unit 44 and the scan register 46 are connected by a scan-in line 52 and a scan-out line 54. The scan register 46 is connected to a data-in line 56, to a data-out line 58 and to the control line 48. In this embodiment the control line 48 includes a plurality of lines. The control line 48 is provided for the collected control signals necessary to read and write the registers 24.

In the GSD test methodology the semiconductor chip does not have a common scan clock distributed over the whole chip. The scan clock is generated locally. With the use of the edge detector 42 in each satellite portion 14 the scan clocks for the scan register 46 may be produced from a global signal. As the global signal the TCK clock input from a JTAG port may be used, for example.

Figure 4:
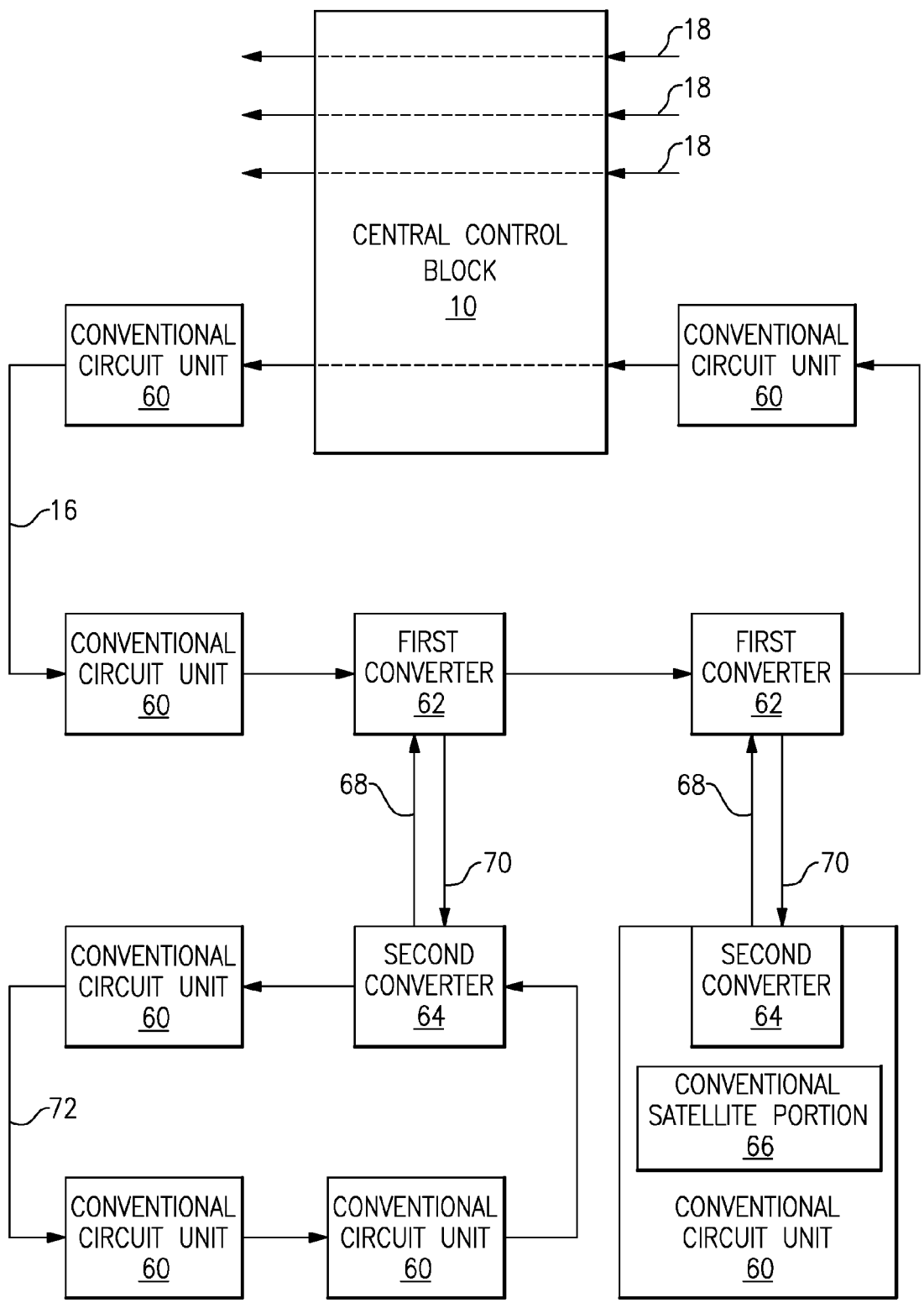
FIG. 4 illustrates a schematic block diagram of an integrated circuit according to the prior art.

FIG. 4 illustrates a schematic block diagram of the integrated circuit in accordance with the prior art. The conventional integrated circuit includes the central control block 10 and conventional circuit units 60. A part of said conventional circuit units 60 are serially connected together via the address and data line 16. This series is connected to the central control block 10 and to first converters 62 via the address and data line

16. The central control block 10, the part of the conventional circuit units 60, the first converters 62 and the address and data line 16 form a ring. The address and data line 16 may be one serial line. Alternatively the address and data line 16 may have one line for addresses and another line for data.

Each of the first converters 62 is connected to a second converter 64 via a first bus 68 and second bus 70. The first bus is a unidirectional bus from the second converter 64 to the first converter 62. The second bus 70 is a unidirectional bus from the first converter 62 to the second converter 64. The first converter 62 and the corresponding second converter 64 form an asynchronous converter block.

The other conventional circuit units 60 and one of the second converters 64 are serially connected via a further address and data line 72 and form another ring. The other second converter 64 is integrated in a separate conventional circuit unit 60.

The first asynchronous converter block connects the one ring formed by the address and data line 16 to the other ring formed by the address and data line 72. A second asynchronous converter block connects said one ring to the single conventional circuit unit 60 with the internal satellite portion 66.

The central control block 10 first selects the address and data line 16. Then the central control block 10 shifts the address package into the address and data line 16. The address package comprises the address of a satellite portion 66, the address of a target register and the operation mode. The operation mode may be a write or a read operation. The addressed satellite portion acknowledges a bit within the bit-stream. The structure of the bit-stream depends on the protocol.

In the case of the write operation the addressed satellite portion 66 waits for a data package to arrive. Then, the addressed satellite portion 66 performs a data access as specified by the operation mode. In the case of the read operation, the satellite portion 66 will fetch the data from the register and serialize it on the address and data line 16 in order to send the data back to the central control block 10. With this approach, it is possible to access one specific satellite portion 66 at a time. In a special case all satellite portions 66 are accessed, if an a priori known broadcast address is used. Unlike an embodiment of the present invention, it is not easy to select a variable set of the satellite portions 66.

If the address and data line 16 have to cross an asynchronous clock boundary, then the handshaking logic has to be used. The handshaking logic is in the asynchronous converter block, which includes the converters 62 and 64. The structure according to an embodiment of the invention avoids those asynchronous converter blocks.

An embodiment of the present invention can also be embedded in a computer program product which comprises all the features enabling the implementation of the methods described herein. Further, when loaded in a computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

The invention claimed is:

1. An integrated circuit comprising:
   a plurality of registers which are writable and readable; a central control block; and
   a plurality of circuit units, wherein the circuit units include a functional portion with a local clock controller and one or more of the registers, wherein the circuit units include a non-functional satellite portion, the central control block being independently coupled to each of the non-functional satellite portions, wherein the central control block and the non-functional satellite portions are serially connected together and form a scan chain for the circuit units, and wherein the scan chain is formed as a ring.

2. The integrated circuit according to claim 1, wherein the satellite portion comprises a bit-stream register provided for select bits, address bits and/or data bits.

3. The integrated circuit according to claim 2, wherein the bit-stream registers in the satellite portions form the scan chain.

4. The integrated circuit according to claim 1, wherein the central control block and the satellite portions are connected by a serial address and data line.

5. The integrated circuit according to claim 1, wherein the central control block is adapted as a scan engine.

6. The integrated circuit according to claim 1, wherein the integrated circuit is adapted to work without functional clocks.

7. The integrated circuit according to claim 1, wherein the integrated circuit is adapted to work with clock signals from the local clock controller.

8. The integrated circuit according to claim 1, wherein the satellite portions are separately selectable by the central control block.

9. The integrated circuit according to claim 1, wherein an edge detector is adapted for the local clock controller.

10. The integrated circuit according to claim 9, wherein the edge detector is adapted to generate internal scan clocks from an external signal.

11. A method for writing and reading registers distributed across a semiconductor chip of an integrated circuit, the method comprising:
   subdividing the integrated circuit into a plurality of circuit units;
   forming a functional portion with a clock controller and one or more of the registers within the circuit units;
   forming a non-functional satellite portion within the circuit units;
   independently coupling at least one central control block to the non-functional satellite portion within each of the circuit units;
   connecting the non-functional satellite portions serially together to form a scan chain for the circuit units;
   forming the scan chain as a ring; and
   performing a scan test by dedicated scan clocks generated by the clock controllers.

12. The method according to claim 11, wherein the at least one central control block is serially integrated into the scan chain.

13. The method according to claim 12, wherein the central control block operates as a scan engine.

14. The method according to claim 11, wherein the scan test is performed without functional clocks.

15. The method according to claim 12, wherein the satellite portions are separately selected by the central control block.

16. The method according to claim 12, wherein an arbitrary number of satellite portions is accessed independently each time.

17. The method according to claim 11, wherein circuit units residing in different clock domains define groups with different functional clock signals.

18. The method according to claim 11, wherein the system is realized in hardware, software or a combination of hardware and software.

19. A computer program product for writing and reading registers distributed across a semiconductor chip of an integrated circuit, the computer program product comprising:
a tangible storage medium readable by a processing circuit and storing instructions for execution by the processing circuit for performing a method comprising:
subdividing the integrated circuit into a plurality of circuit units;
forming a functional portion with a clock controller and one or more of the registers within the circuit units;
forming a non-functional satellite portion within the circuit units, the forming the non-functional satellite portion comprising:
coupling an input of a first AND gate to a bit stream register comprising a side information portion and a data portion and an output of the first AND gate to the clock controller; and
coupling an input of a second AND gate to at least one other non-functional satellite portion of another circuit unit and an output of the second AND gate to the bit stream register;
independently coupling at least one central control block to the non-functional satellite portion within each of the circuit units;
connecting the non-functional satellite portions serially together to form a scan chain for the circuit units;
forming the scan chain as a ring; and
performing a scan test by dedicated scan clocks generated by the clock controllers.

20. The method according to claim 19, wherein at least one central control block is serially integrated into the scan chain.

* * * * *